United States Patent [19]

Witchey

[11] 4,361,365
[45] Nov. 30, 1982

[54] KNIFE EDGE BEARING SYSTEM

[75] Inventor: Albert L. Witchey, Robbinsville, N.J.

[73] Assignee: RCA Corporation, New York, N.Y.

[21] Appl. No.: 183,621

[22] Filed: Sep. 2, 1980

[51] Int. Cl.³ ............................................. F16C 32/02
[52] U.S. Cl. .................................................. 308/2 R
[58] Field of Search ........................ 308/2 R, 2 A, 21; 324/158 P, 158 F

[56] References Cited

U.S. PATENT DOCUMENTS

| 2,936,994 | 5/1960 | Lan . | |
| 3,096,839 | 7/1963 | Van Mastrigt . | |
| 3,421,595 | 1/1969 | Kuhnle | 308/2 R |
| 3,453,545 | 7/1969 | Oates . | |
| 3,758,173 | 9/1973 | Bucher | 308/2 R |
| 3,815,695 | 9/1973 | Schwarz . | |
| 4,321,122 | 3/1982 | Whitcomb | 324/158 P |

Primary Examiner—Lenard A. Footland

Attorney, Agent, or Firm—Samuel Cohen; William Squire

[57] ABSTRACT

An upper disk which is fixed to a tiltable arm and is formed with a groove in its circular peripheral surface is engaged with and seats between two lower circular disks having mating V-shaped knife edges, the two lower disks being fixed to a support. A second upper disk on the tiltable arm also has a groove in its circular peripheral edge and is in engagement with a lower disk on the support, the lower disk having a V-shaped knife edge. The two upper disks and the three lower disks provide three point contact to prevent orthogonal lateral and axial movement of the arm with respect to the support and to avoid friction engagement between the two sets of disks while providing accurate means for relocating the arm to its previous position after the arm has been raised, that is, when the upper disks are returned to their mating position with the lower disks after having been disengaged therefrom.

12 Claims, 4 Drawing Figures

U.S. Patent  Nov. 30, 1982  4,361,365
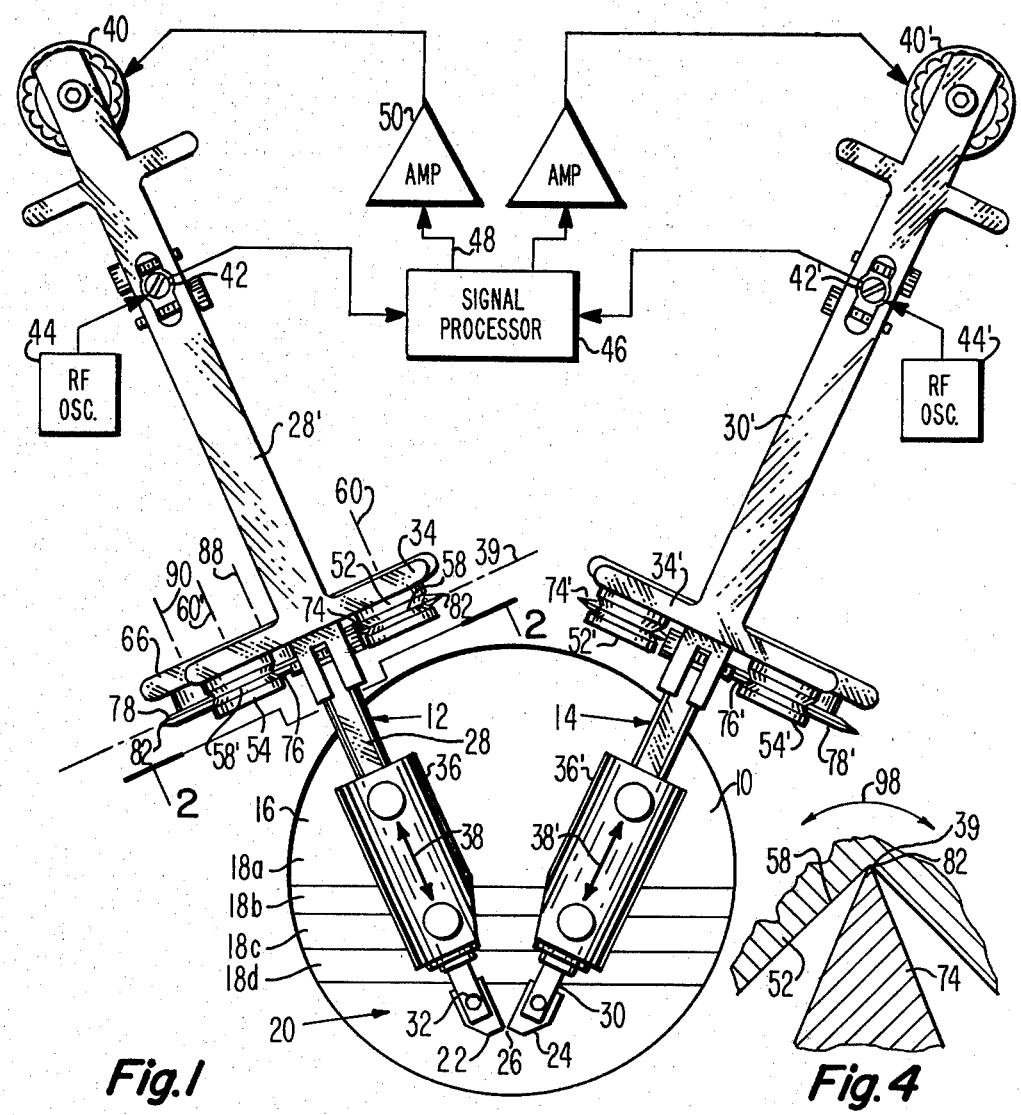
Fig.1
Fig.4
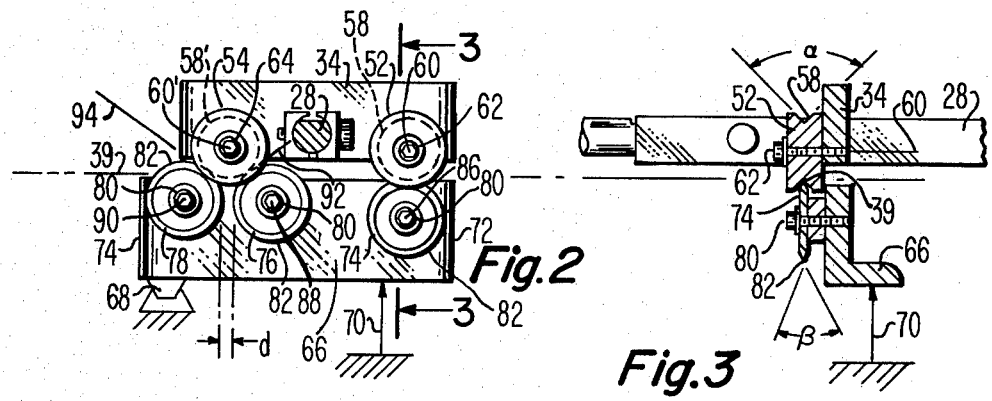
Fig.2
Fig.3

KNIFE EDGE BEARING SYSTEM

The present invention relates to knife edge bearing systems and more particularly, to such systems as employed in apparatus for testing semiconductor devices.

In the manufacturing of semiconductor devices, e.g. integrated circuit devices, it is the practice to provide, by various techniques semiconductor device chips or pellets on a single semiconductor wafer. The wafer thereafter is diced to provide individual semiconductor device pellets which are then assembled within semiconductor device envelopes.

The semiconductor wafer comprises a number of microscopic thin layers of different materials. The testing of the different layers in the wafer prior to its further processing into semiconductor devices includes measurement of the spreading resistance of the wafer material. The round thin silicon wafer is surface ground on one surface forming an oblique cylinder from a right cylinder. The angle between the plane containing the newly ground surface and the plane containing the original base of the chip is extremely small for the purpose of exposing successive layers of deposited coatings on the wafer. The electrical resistance between two points on this surface may be measured by using between two small electrodes in an electrical probe system. The electrodes, which are spaced apart a thousandth of an inch, must be lowered gently to the wafer surface to avoid impact damage.

Electrical resistance measurements are made in a large number of closely spaced locations throughout the wafer. At times the electrodes may wear or otherwise become unuseable and require replacement. It is critically important that when they are removed, they be returned to the test apparatus in the same location from which the last measurement was made to ensure the integrity of the previous measurements. A single wafer requires hundreds of measurements and therefore it would be extremely time consuming to start measurements from the beginning.

The electrodes are mounted on a beam balance system. Replacement of the electrode tip requires removal of the beam balance portion securing the electrodes from the remaining system. The beams with the electrodes are later returned to the system. As already mentioned the electrodes should be returned to their last position on the wafer within micro-inches.

A conventional beam balance employs a knife edge which serves as a pivotal axis. The beam can assume a position along the length of the axis determined by one or more stops or guides. If the beam is caused to engage the stop, friction is introduced into the system which is undesirable.

A resistance measuring system as described above, requires a virtually friction-free support for the beam while it is being driven cyclically about the pivotal axis. Further the beam must be capable of being accurately positioned to a particular location along the length of the pivot axis. The beam (on which the electrodes are mounted) must be easily removable for repairing or replacing the electrodes and must then be capable of being returned in very precise fashion to its last position.

Prior art beam balance systems employ knife edges in which portions of the moving system may engage other portions for introducing friction which has a significant bearing on the accuracy of the measurements. The measurements of resistance of a wafer as discussed above have a significant relationship to the pressure of the electrodes on the contact surface. Some prior art systems while employing so-called "knife edge" bearings introduce some sliding friction to the assembly which may result in inaccuracies in pressures applied by the system for wafer resistance measurement. Other systems while employing so-called "knife edge" configurations cannot be separated and returned to the original position with the accuracy described.

A knife edge bearing system embodying the present invention comprises three groups of engaged circular knife edge disk members. Each disk member is engaged at its circumferential edge with another disk member to thereby provide point contact therebetween. Means secure one disk of each group in a first fixed spaced relationship and the remaining disk of each group in a second fixed spaced relationship such that the one disks pivot about the other disks in unison about a common axis passing through said points.

In the drawing:

FIG. 1 is a plan view of an electrical resistance probe system embodying the present invention, FIG. 2 is an elevation view taken along lines 2—2 of one of the bearing systems of the embodiment of FIG. 1, FIG. 3 is a sectional view taken along lines 3—3 of FIG. 2, and FIG. 4 is an enlarged sectional view of one of the knife edges of FIG. 2.

Workpiece wafer 10 is shown having its resistance measured by a probing apparatus 20 which comprises probe assemblies 12 and 14 which cooperate with each other to make electrical resistance measurements on the wafer 10. Wafer 10 is a thin disk of semiconductor material, e.g., silicon, and has a surface 16 at which a plurality of layers 18a, 18b, 18c, 18d are exposed for electrical resistance measurements. In testing electrical resistance of the various layers 18a–18d, probe assemblies 12 and 14 contact the surface with electrodes 22 and 24 attached to their respective ends. The spacing 26 between the electrodes 22 and 24 may be a thousandth of an inch. Electrodes 22 and 24 are replaceable elements which are secured to elongated arms 28 and 30 of the respective probe assemblies. Arm 28 is secured to arm structure 28' and arm 30 is secured to arm structure 30'. The electrodes 22 and 24 which have needle tip probe elements (not shown) must make consistent and uniform electrical contact in hundreds of locations throughout the surface of the wafer 10. The exact locations for the tests are determined by a computer controlled work piece operating table (not shown) which automatically positions the wafer at predetermined desired locations.

The probe assemblies 12 and 14 are identical and therefore only assembly 12 will be described. Electrode 22 is releasably secured to the arm 28 by screw 32. The arm 28 is secured to a cross beam 34 in structure 28'. Slidably mounted on the arm 28 is a balance weight 36 which moves in the directions 38 for balancing the assembly 12 about pivot axis 39. The arm 28 may be a long slender rod. On the opposite side of beam 34 secured to arm structure 28' is a drive or moving coil 40 and a differential transducer 42 which is mounted on the underside of the arm 28. Secured to the probe assembly support table (not shown) is a moving coil magnet which fits within the coil 40 and a mating differential transducer 42 element. The latter produces a signal representing the vertical displacement in and out of the drawing of the arm structure 28' with respect to the table (not shown). The coil 40 and transducer 42 are conventional. The transducer 42 is coupled to an RF oscillator 44 whose output is applied to transducer 42 in a known manner and also to a signal processor 46 whose output 48 is applied to an amplifier 50 for applying a drive signal to the coil 40. When current is applied to the coil 40 a magnetic field is created which reacts with the field of a fixed magnet (not shown). This causes the arm structure 28' to move in and out of the drawing at the location of the coil 40. This displacement rocks the assembly 12 about pivot axis 39. This displacement is measured by the differential transducer 42. The output of the transducer 42 is processed by signal processor 46, which includes a computer, for generating an output signal at output 48 for positioning the system about axis 39 in accordance with a predetermined program. In a similar manner, the probe assembly 14 is also driven by the processor 46.

Attached to the beam 34 are two circular disks 52 and 54 which are spaced on opposite sides of the arm 28 as shown in FIG. 1. The disks 52 and 54 each have identical respective V-shaped grooves 58 and 58' respectively in their peripheral surfaces. The groove 58, has an angle $\alpha$ FIG. 3 preferably of 90°. A common plane about which disks 54 and 52 are centered, passes through both disks so that the disks are parallel to each other. Disks 52 and 54 are secured to beam 34 at their centers 60 and 60', respectively by screws 62 and 64, respectively.

The disks 52 and 54 are secured tightly to the beam 34. However, loosening the screws 62 and 64 loosens the disks 52 and 54 sufficiently so that they each may be rotated about their respective axes 60 and 60'. For this reason, the screws 62 and 64 are closely fitted within corresponding bores in the centers of the disks 52 and 54. The grooves 58 and 58' are each formed with a relatively sharp valley at the intersection of the groove sidewalls at the root of the groove.

In FIG. 2 lower support 66 is pivotally secured at 68 to a fixed table at one end 74 of support 66. An adjustment device 70 near the other end of support 66 adjusts the vertical position of end 72 of support 66 with respect to end 74. Support 66 is directly underneath the beam 34. In the alternative, support 66 can be fixed to a table and need not be made adjustable. Secured to support 66 are three identical circular knife edge disks 74, 76 and 78 which are secured to the support 66 by screws 80. Disks 74, 76, and 78 are coplanar and the plane about which they are centered is the plane about which disks 52 and 54 are centered.

Each of disks 74, 76 and 78 has a knife edge 82 extending completely around its peripheral surface. The knife edge 82, FIG. 3, comprises two sidewalls which taper to form a sharpened peripheral edge. The sidewalls intersect at an angle $\beta$. $\beta$ preferably is about half the value of $\alpha$ and in this case is about 45°. In FIG. 4, the disk 52 rocks in the directions 98 about the knife edge 82, at the point of contact between the two through which the pivot axis 39 passes. Because the groove 58 and the edge 82 are both circular they contact each other at a point at the location of the common tangent to the two circles. The edge 82 and root of the groove 58 are sharp having a radius of about a few thousands of an inch. The friction created by such sharp mating elements is relatively negligible.

This point contact is extremely important for the probe assembly of the present embodiment. This point contact substantially avoids any slidable engagement between the edge 82 and the groove 58. That is, as the disk 52 rocks about the edge 82 of disk 74 the rocking motion in the direction 98 is about a point and therefore no sliding engagement, in the pivoting direction 98, occurs between the edge 82 and the surfaces defining groove 58. Any such sliding engagement would be disadvantageous as it would introduce friction which would reduce the accuracy of the measurements made by the probe assembly. Such friction also would introduce inaccuracies in the lowering of the probe electrodes onto the wafer 10 which could cause variations in impact force exerted on the wafer and impact damage to the wafer. Impact force variations, when present, introduce errors in the electrical resistance measurements.

The disk 74 is preferably directly beneath the disk 52 so that its center 86 is directly beneath the center 60 of the disk 52 engaged therewith. Disks 76 and 78 centers 88 and 90 are spaced apart horizontally so that their respective knife edges 82 are spaced apart a distance d less than the root diameter of the groove 58' of disk 54 engaged therewith. Spacing d being less than the root diameter of the engaged groove 58' disk 54 ensures that disk 54 self centers between the disks 76 and 78. Therefore the tangent 92 between disks 76 and 54, and tangent 94 between disks 54 and 78, intersect. Also, the contact points of tangents 92 and 94 between disks 54 and 26, 78 and disks 52 and 74 lie on a straight line coincident with axis 39. This provides a single pivot axis for all of the disks. The disk 54 is thus restrained from moving left to right in the drawing along the pivot axis by the disks 76 and 78, it being held in place by gravity. The edges 82 of the disks 76 and 78 make point contact with the groove of disk 54 similarly to the point contact engagement between disks 52 and 74, FIG. 3, as described above. The diameters of the various disks preferably should be about the same size, but this is not essential.

If vertical lines (not shown) were drawn through the centers of disks 76 and 78 forming two parallel lines, it is seen that the contact points for disk 54 with disks 76 and 78 along tangents 92 and 94, respectively, lie in the space between the two parallel lines. Similarly, if instead of a single disk 54, two disks (not shown) were employed, one of these latter disks would engage disk 76 and the other disk 78. Their contact points also would lie between the two above-mentioned parallel lines. In the alternative, the two disks (not shown) could be spaced such that their contact points lie outside the space formed by the two parallel lines. In this case one of these disks would be centered above and to the left of disk 78 and the other centered above and to the right of disk 74 as viewed in FIG. 2. In any case, all contact points would lie on a straight line forming the pivot axis such as axis 39. Any of the above combinations would form a configuration in which the upper disks would sit on and be nested with the lower disks such that motion along and normal to axis 39 are precluded.

In summary, the construction described provides three points of engagement between the disks 52 and 54 with the disks 74, 76 and 78. The three points of engagement are thus formed by three corresponding "groups" of disks, 54–78, 54–76, and 52–74, although in the embodiment shown two "groups" have a common disk (disk 54). The points of engagement are important. The knife edge engagements of the lower disks with the upper disks prevent movement in the direction of the disk axes, of the upper and lower disks, that is, movement in a direction in and out of FIG. 2 of the drawing. The two lower disks 76 and 78 lessen any tendency for lateral movement of the common disk 54, that is, they tend to eliminate movement along pivot axis 39, (movement to the left and right as viewed in FIG. 2 of the drawing). This latter "stiffness" in the direction of axis 39 without significant friction is extremely important. Therefore, the only motion permitted the disks 52 and 54 with respect to the disks 74, 76 and 78 is a pivoting motion in the directions 98 about their points of contact with the knife edges of disks 78, 76 and 74, that is, pivoting motion about axis 39.

Separation of the knife edges occurs when the beam 34 and attached arm structure 28' assembly are removed and disengaged from the lower disks 74, 76 and 78 by lifting in the upward direction. The return of the disks 52 and 54 into engagement with their respective corresponding disks 74, 76 and 78 at a subsequent time accurately locates probe electrodes 22 and 24 to the same exact location within microinches of their previous location. This is because there is essentially no friction at the point contacts between the disks and the various knife edges during use. Therefore, the position of the knife edges when they were first separated is automatically located when they are returned to the engaged condition. In prior art assemblies sliding friction is present which introduces inaccuracies in returning the assemblies to their engaged state. This friction permits a relatively wide latitude of static positions of the mating parts. The use of two disks 76 and 78 to engage the one upper disk 54 accurately locates the disk 54 in the vertical direction when disengaged and then reengaged.

While a single lower disk may provide point contact with the upper disk 54 additional means would then be required to prevent left and right motions (FIG. 2) of the beam 34. Prior art devices employ stops or other similar mechanisms which prevent such lateral motions but such stops employ friction engagements. Such friction engagements are undesirable in a probe system of the type described and introduce errors when relocating the upper assembly when engaged with the lower assembly. In the present invention no lateral stops are required to provide accurate location of the beam 34 with respect to the support 66 in either of two orthogonal directions left and right in the drawing and perpendicular to the drawing.

Disk 52 is substantially vertically above the disk 74. This is not essential. The centers 60 and 86 of the respective disks 72 and 74 need not be in the same horizontal planes as the corresponding centers of disks 54, 76 and 78. When the adjustment device 70 which may comprise a screw or lever mechanism is adjusted in the vertical direction, it will occur that the centers 60 and 86 are moved vertically with respect to the centers of the other disks. What is important is that all of the contact points lie on a straight line. The beam 34 is moved in a vertical direction by the adjustment device 70 but the horizontal position of the electrodes 22 and 24 of FIG. 1 in the directions 38 is not significantly altered, the vertical motions being displacements in the order of a small fraction of an inch. The vertical adjustment is for the purpose of providing adjustment of the pressure of electrodes 22 and 24 on wafer 10 surface 16. Thus while the vertical displacement of the electrodes 22 and 24 can be accurately controlled, substantially no significant change is made in their horizontal position on surface 16 of the wafer. This is important for assuring accurate measurements on the wafer.

The lifting mechanism for raising and lowering the electrodes 22 and 24 comprises RF oscillator 44, signal processor 46, amplifier 50, differential transistor 42 and coil 40 and associated magnet (not shown) described above. These elements in conjunction with a table positioning device for positioning the wafer 10 with respect to the position of disk 54 automatically cause the probe electrodes 22 and 24 to raise and lower at different locations along the wafer surface 10. Hundreds of points may be contacted on the wafer 10 during a given measurement sequence. As the electrodes wear or as different characteristics appear in the test results it may be desired to lift the electrodes or even change the electrodes on a given probe assembly. To do this beam 34 and disks 52, 54 are lifted out of engagement with the lower disk. The knife edge arrangement described permits extremely accurate return of the upper portion of the probe assembly to engagement with the lower portion so that no significant change in assembly location with respect to the wafer 10 is introduced by such temporary disassembly. Thus, each probe assembly 12 and 14 has an accurately defined position whether at rest or when in contact with the wafer 10.

What is claimed is:

1. A system for supporting a member for pivotal motion about a longitudinal axis with little friction and with little tendency for movement along the length of the axis, comprising:
   a support which is fixed relative to said axis;
   a first set comprising two circular disks secured to one of said member and support, said two disks lying in a plane and being spaced apart edge-to-edge, and
   a second set comprising three circular disks secured to the other of said member and support, the disks of one set each being formed with a circumferential knife edge, and the disks of the other set each being formed with a circumferential edge portion against which the knife edge of a disk in the one set bears when the two disks meet, edge-to-edge, the disks of said second set being spaced apart edge-to-edge and lying in said plane, the spacing between the disks in the second set being such that one disk of the first set bears against a pair of adjacent disks in the second set edge-to-edge, and the other disk of the first set bears against the third disk of the second set edge-to-edge, the points of contact of the first with the second set of disks lying on said axis.

2. The system of claim 1 wherein the centers of said other disk of the first set and the third disk of the second set against which it bears lie on a vertical line.

3. The system of claim 1 wherein the edge portions of each disk of said other set comprises a circumferential groove, each such groove having side walls intersecting at about 90° and wherein said knife edges in said one set of disks are V-shaped with side walls intersecting at about 45°.

4. The system of claim 1 wherein the edge portion of each disk of said other set comprises a circumferential V-shaped groove.

5. The system of claim 1 wherein said disks include means for rotatably securing the disks to their respective member and support.

6. A balancing apparatus comprising:
   a first connecting member;
   a second connecting member;
   first and second spaced circular disks in a first set secured to the first member; and
   third, fourth and fifth spaced circular disks in a second set secured to the second member; the disks of one set having knife edges extending around their peripheries, the disks of the other set having means extending around their peripheries which engage with and bear against said knife edges in point contact, one disk in said first set being in engagement with two of said third, fourth, and fifth disks, said two disks being spaced apart at their knife edges or said means a distance smaller than the diameter of said knife edges or said means of said one disk;

the other disk of said first set being secured in engagement with the remaining disk of said second set, all said disks being centered about the same plane, said points of contact of all said disks lying in a straight line.

7. The apparatus of claim 6 wherein one of said connecting members is adjustable.

8. A knife edge bearing system comprising:
a first member;
a pair of circular disks secured to said first member, each disk having first circular knife edge means;
a second member;
a set of three circular disks secured to said second member, each disk of the set having second circular knife edge means which bear against and mate with the first knife edge means in point contact when engaged with the knife edge means of one disk of the set, the other disk of the pair being engaged with the remaining disks of the set at their respective knife edge means, a line passing through the point of contact of and tangent to the other disk with one of the remaining disks being non-parallel to a line passing through the point of contact of and tangent to the other disk with the other of the remaining disks, all said points of contact lying on a straight line.

9. The bearing system of claim 8 wherein a line passing through the contact point of and tangent to the engaged one disks is horizontal, the remaining disk of the set forming a lower pair, said lower pair forming an aligned seat for the upper remaining disk of the pair engaged therewith preventing transverse and axial movement with respect to said line of said first member with respect to said second member.

10. A knife-edge bearing system comprising:

three groups of engaged circular knife edge disk members, each disk member being engaged at an edge along its circumferential edge with another disk member to thereby provide point contact therebetween, the three groups engaging at three corresponding spaced points, and means for securing one disk of each group in a first fixed spaced relationship and the remaining disk of each group in a second fixed spaced relationship such that the one disks pivot about the other disks in unison about a common axis passing through said points, vertical parallel lines passing through the centers of two of said other disks defining a given space, the two point contacts corresponding to said two other disks being either both within or both outside said given space.

11. The system of claim 10 wherein one of the engaged sets includes means for adjusting that set vertically.

12. A system for supporting a movable means for pivotal motion about an axis with little friction and with little tendency for movement along the length of the axis, comprising, in combination:

support means which is fixed relative to said axis;

first and second disk shaped elements secured to one of said means, said elements being spaced apart, edge-to-edge and parallel to a plane in which said axis lies, said plane passing through both elements, each element being formed with a circumferential groove along its outer edge, the root of the groove, in one case, being intersected by the axis and in the other, tangent to the axis;

third, fourth and fifth disk shaped elements secured to the other of said means, said third, fourth and fifth elements being spaced apart, edge-to-edge, and parallel to said plane, said plane passing through the third, fourth and fifth elements, the third, fourth and fifth elements all being formed with a circumferential knife edge, the first element self-seating with its groove mating with and engaging the knife edges of the third and fourth elements and the knife edge of the fifth element mating with and engaging the groove of the second elements, the three points of contact among the five elements lying on said axis.

* * * * *